United States Patent
Hamid

Patent Number: 5,655,109
Date of Patent: Aug. 5, 1997

[54] AUTOMATED CELL CHARACTERIZATION SYSTEM

[75] Inventor: Adnan Hamid, Austin, Tex.

[73] Assignee: Advanced Micro Devices, Inc., Austin, Tex.

[21] Appl. No.: 447,814

[22] Filed: May 23, 1995

[51] Int. Cl.$^6$ ................................................. G06F 17/00
[52] U.S. Cl. ........................... 395/500; 364/490; 364/578
[58] Field of Search ................................. 364/488, 489, 364/490, 491, 578; 395/500

[56] References Cited

U.S. PATENT DOCUMENTS

| | | | |
|---|---|---|---|
| 5,249,156 | 9/1993 | Hagiwara et al. | 365/228 |
| 5,274,568 | 12/1993 | Blinne et al. | 364/489 |
| 5,452,225 | 9/1995 | Hammer | 364/488 |
| 5,504,694 | 4/1996 | George et al. | 364/514.12 |
| 5,519,848 | 5/1996 | Wloka et al. | 395/500 |

*Primary Examiner*—Kevin J. Teska
*Assistant Examiner*—Matthew Loppnow
*Attorney, Agent, or Firm*—Haynes and Boone, L.L.P.

[57] ABSTRACT

Method and apparatus for automating the process of characterizing a standard cell library at multiple operating points is disclosed. In a departure from the art, a CHARS utility of the present invention sensitizes each arc of each cell of the cell library and then runs a matrix of experiments, stepping input transition times against output loads, for each sense of each arc of each cell to compute timing model timing coefficients for input to a synthesis and optimization tool such as SYNOPSYS. In a preferred embodiment, CHARS is implemented using a two pass HSPICE algorithm and each pass comprises generating a set of HSPICE decks for each sense of each arc in each cell and then running HSPICE to simulate the timing behavior of the cell. The first pass generates HSPICE decks for computing pin capacitances, input threshold voltage and the maximum load the cell can drive. The second pass uses the information generated during the first pass to do a detailed characterization analysis on the cell. For each sense of each arc in each cell, CHARS runs a matrix of experiments, stepping input transition times against output loads. The matrix of data is then analyzed to generate timing model coefficients. Setup and hold parameters for sequential cells are also computed at that time.

25 Claims, 4 Drawing Sheets

AUTOMATED CELL CHARACTERIZATION SYSTEM

TECHNICAL FIELD

The invention relates generally to the automated synthesis and optimization of logic circuits and, more particularly, to the automated characterization and modelling of standard cell libraries.

BACKGROUND OF THE INVENTION

Until the early 1970s, electronic circuits were analyzed and designed almost exclusively by hand. Since that time, the ever increasing demand for more complex integrated circuits (ICs) has made computer aided design (CAD) and computer aided engineering (CAE) tools practically indispensable in the design of ICs, as such tools enable the rapid synthesis, optimization and analysis of an IC design, using parameters as specified by the designer. CAD and CAE tools can also manage masses of data that would otherwise overwhelm the designer, while computer-based layout design systems are useful in preparing and modifying the geometric patterns, or "layouts," required for IC masks.

A large amount of random logic undergoes automated synthesis during the design of an IC. In general, automated synthesis allows a user to describe, in a high level language, for example, Verilog or VHDL, what functions the IC is to perform, at which point a CAE tool will turn the description into the actual gates and transistors and interconnections thereof comprising the IC. One CAE tool commonly used for such automated synthesis and optimization is SYNOPSYS, available from Synopsys, Inc., of Mountain View, Calif. In operation, SYNOPSYS makes use of a cell library comprising a large set of simple logic cells, such as NAND, NOR, AND and OR gates, as well as flip flops and latches, of varying sizes and numbers of inputs. A large cell library will result in a more efficient and accurate synthesis, as it gives SYNOPSYS a greater number of options in synthesizing a given circuit.

The two main goals to be achieved with automated synthesis are maximizing the overall performance, or speed, of the IC, while minimizing the overall area of, and therefore the expense of producing and power consumed by, the IC. More often than not, these two goals will be at odds with one another, as a large cell will drive a large load faster, but consume more power, than a smaller cell can drive the same load. Accordingly, for each cell in the cell library, SYNOPSYS must be given a good idea of the propagation delay, that is, the speed, of the cell. It is generally accepted that the two parameters that have the greatest effect on the propagation delay of a cell are the size of the load being driven by the cell, designated $C_{load}$, and the input transition time, designated $S_{in}$, of the cell. Accordingly, each cell in the library must be "characterized" with respect to timing characteristics thereof such that, for a given input transition time and load value, SYNOPSYS is able to determine the resulting transition delay of the cell.

In this regard, SYNOPSYS supports two timing models, which are a three term linear model of the form:

$$t_d = a_0 + a_1 S_{in} + a_2 C_{load}$$

where $t_d$ is the propagation delay of the cell, $S_{in}$ is the input transition time of the cell, and $C_{load}$ is the load being driven by the cell, and a lookup table model of the form:

$$t_d = \text{cell\_delay} + \text{output\_tran}$$

where values for cell_delay (cell delay) and output_tran (output transition time) for varying values of $S_{in}$ and $C_{load}$ are stored in lookup tables. In short, characterizing a cell involves computing SYNOPSYS propagation delay parameters for the cell for each of the models. Characterizing a library of 1500 cells would typically take about 3 man-months, that is, it would take one person three months to characterize an entire library. Clearly, automating this task would be a great advantage in terms of conservation of engineering time.

Therefore, what is needed is a utility for automatically computing timing characteristics for each cell in a standard cell library for use by an automated synthesis and optimization tool, such as SYNOPSYS.

SUMMARY OF THE INVENTION

The foregoing problems are solved and a technical advance is achieved by method and apparatus for automating the process of characterizing a standard cell library at multiple operating points. In a departure from the art, a CHARS utility of the present invention sensitizes each arc of each cell of the cell library and then runs a matrix of experiments, stepping input transition times against output loads, for each sense of each arc of each cell to compute timing model timing coefficients for input to a synthesis and optimization tool such as SYNOPSYS.

In a preferred embodiment, CHARS is implemented using a two pass HSPICE algorithm and each pass comprises generating a set of HSPICE decks for each sense of each arc in each cell and then running HSPICE to simulate the timing behavior of the cell. The first pass generates HSPICE decks for computing pin capacitances, input threshold voltage and the maximum load the cell can drive. The second pass uses the information generated during the first pass to do a detailed characterization analysis on the cell. For each sense of each arc in each cell, CHARS runs a matrix of experiments, stepping input transition times against output loads. The matrix of data is then analyzed to generate timing model coefficients. Setup and hold parameters for sequential cells are also computed at that time.

In a preferred embodiment, driver cells are used to drive the inputs of the cell being characterized. Accordingly, before characterization of any library cell may be performed, each driver cell must itself be characterized. Accordingly, each driver is driven with a range of output loads ($C_{load}$) to create a table of output transition times versus load for a particular $S_{in}$. This table, along with the pin capacitances of the library cell, can be used to predict the value of $C_{in}$ of the testbed comprising the driver cell required to produce a particular input transition time for the cell being characterized.

In one aspect of the invention, CHARS automatically generates a set of ARC files for all combination logic cells not containing sequential logic gates, it being understood that custom ARC files must be generated for each remaining cell class. In particular, for a given arc through a cell, there may be more than one solution to "sensitizing" the arc such that a change in the input will effect a change in the output; however there will be only one solution that will capture the worst case capacitance that can be on that input-to-output path. It is this solution that CHARS determines.

In another aspect of the invention, CHARS comprises a job flow algorithm that enables the simultaneous use of a plurality of compute servers in parallel for processing data. In particular, the first stage in the characterization algorithm is to characterize all the driver cells that will be used in the characterization flow. Accordingly, each driver is distributed to a different compute server to reduce the overall time needed to characterize the drivers. Next, the first pass HSPICE decks are generated for all the cells to be characterized at each operating point. Sets of decks are batched into jobs which are submitted to a compute que, which in turn dispatches the jobs to the available servers. Both the size of the job and the depth to which the queue is filled can be controlled. Whenever a first pass job returns, the output is analyzed and the second pass jobs for those cells generated. Once the second pass jobs return, they are analyze in order to generate the timing model files. In addition, CHARS can be provided a prioritized list of cells that need to be characterized, thereby allowing the more critical cells to be analyzed first without interrupting the flow of keeping all available compute servers 100% utilized. The job flow algorithm utilizes the UNIX file system to preserve its state, thereby allowing easy inspection of the status and easy recovery and restart of specific jobs if either CHARS or one of the compute servers fails.

A technical advantage achieved with the present invention is that it may be used to characterize entire cell libraries in a fraction of the time previously necessary to do so.

A further technical advantage achieved with the invention is that it is as accurate, if not more accurate, than conventional characterization methods.

A further technical advantage achieve with the invention is that it can be used to generate timing coefficients for both the linear and look-up table SYNOPSYS models.

DESCRIPTION OF THE PREFERRED EMBODIMENTS

As used herein, the following terms are defined to have the following meanings. "Cell type" is a class of cells, such as two-input NAND gates (nand2), of which there are several sizes, e.g., nand2a, nand2b. "Cell size," or simply "cell," is used to refer to a particular size of a given cell type. "Arc" is a timing path from a particular input to a particular output of a cell which can be sensitized for characterization purposes. "Sense" refers to the direction in which the output of an arc is transitioning; hence, the sense of an arc can be either rising or falling. "Arc definition" is the set of stimuli used to sensitize a particular arc along with unateness information for that arc. Any rising or falling sense information refers to the transition on the output of the arc. An arc definition contains all of the information specific to an arc needed to set up SPICE experiments to characterize one or both senses of the arc. "Setup hold arc" refers to the set of stimuli used to setup a sequential cell for setup and hold timing measurements. Any rising and falling sense information refers to the change in the D input of the latch or flipflop.

Figure 1:
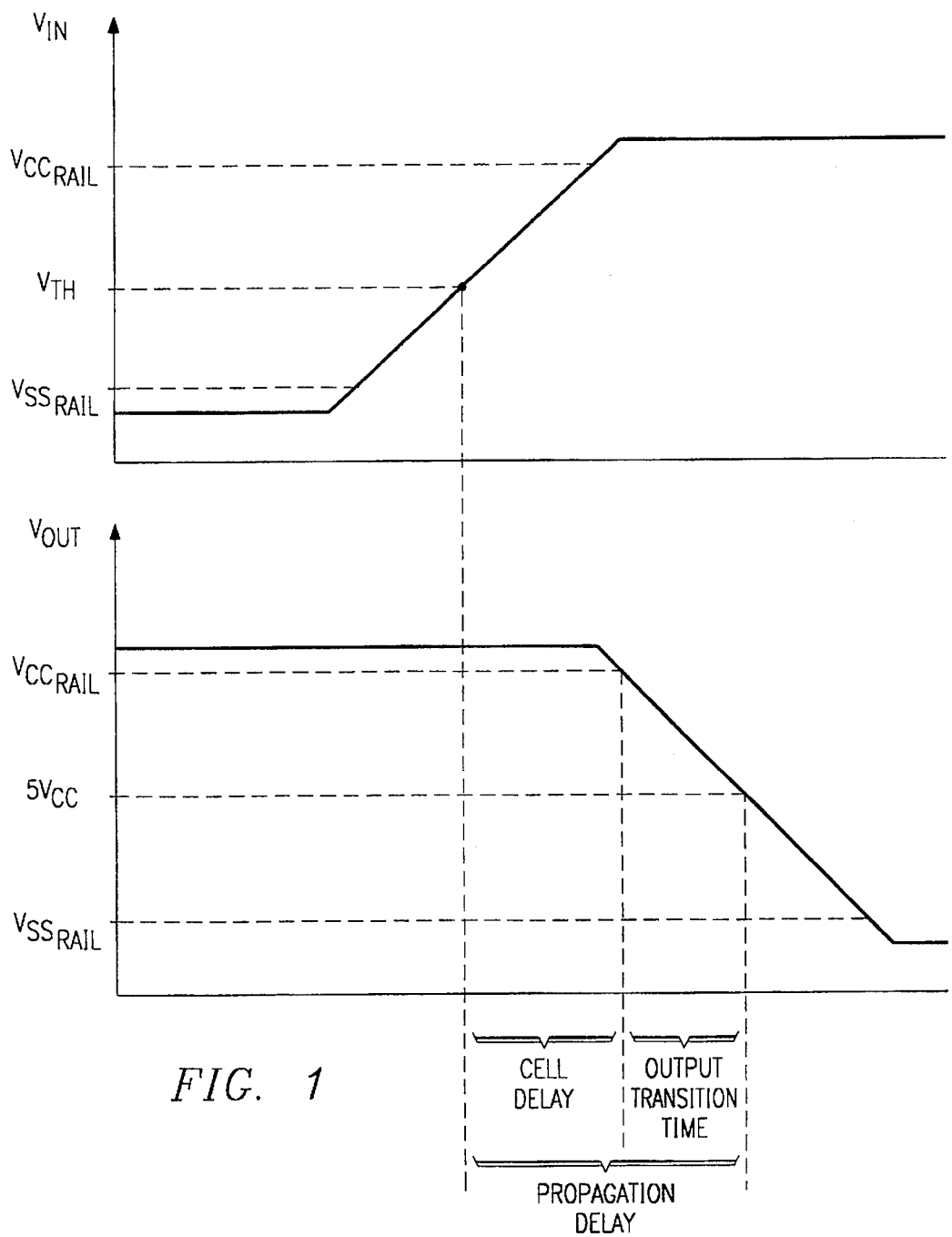
FIG. 1 shows timing diagrams for illustrating propagation delay, cell delay and output transition time of a cell.

FIG. 1 illustrates a timing diagram of an input voltage ($V_{in}$) and resulting output voltage ($V_{out}$) for a cell. Referring to FIG. 1, "rail voltage" is defined as the threshold beyond which a signal is declared to be at Vcc or Vss. In a particular embodiment, the Vcc rail voltage ($Vcc_{rail}$) is defined to be ninety percent (90%) of the supply voltage and the Vss rail voltage ($Vss_{rail}$) is defined to be ten percent (10%) of the supply voltage. "Input threshold voltage" ($V_{th}$) is the input voltage ($V_{in}$) that causes an equal output voltage ($V_{out}$). "Input transition time" ($S_{in}$) is the time it takes $V_{in}$ to switch from $Vss_{rail}$ to $V_{th}$. "Output transition time" (out_tran) is the time it takes $V_{out}$ to switch from Vcc rail to fifty percent of Vcc (0.5 Vcc). "Propagation delay" ($t_d$ or prop_delay) is the time from when $V_{in}$ is equal to $V_{th}$ to when $V_{out}$ is equal to 0.5 Vcc. "Cell delay" (cell_delay) is the time from when $V_{in}$ is equal to $V_{th}$ to when $V_{out}$ changes past $Vcc_{rail}$. As shown in FIG. 1, cell delay for a particular cell at a particular operating point is equal to propagation delay less output transition time.

The goal of cell library characterization is to generate cell timing models for use in simulation and synthesis. At least one synthesis and optimization tool, i.e., SYNOPSYS, supports a linear cell timing model of the form:

$$t_d = a_0 + a_1 S_{in} + a_2 C_{load}$$

where $t_{delay}$ is the propagation delay of the cell, $S_{in}$ is the input transition time of the cell, and $C_{load}$ is the load being driven by the cell. In the SYNOPSYS linear model, the term "$a_0 + a_1 S_{in}$" represents the cell delay of the cell and "$a_2 C_{load}$" represents the output transition time of the cell.

Additionally, SYNOPSYS supports a lookup table timing model of the form:

$$t_d = \text{cell\_delay} + \text{output\_tran}$$

where values for cell_delay (cell delay) and output_tran (output transition time) at various operating points ($C_{load}$, $S_{in}$) of the cell are stored in lookup table form.

Cell characterization involves calculating the timing coefficients and lookup table values for the timing model to be used. In accordance with a feature of the present invention, these computations are performed by using a well-known circuit level simulator known as SPICE to run experiments with varying values of input transition ($S_{in}$) and output load ($C_{load}$) values. In a preferred embodiment of the present invention, a particular version of SPICE, known as HSPICE, which is commercially available from Meta-Software, Inc., of Campbell, Calif., is used to run the experiments, it being understood that any number of different commercially available circuit level simulators could be used. An experiment is run on each sense (i.e., rising and falling) for every arc of each cell for each matrix entry ($C_{load}$, $S_{in}$). Each experiment measures the propagation delay ($t_d$) and output transition delay of the cell for the particular sense on the particular arc. As will be described, characterization of a cell is accomplished using a characterization testbed and two characterization passes.

Figure 2:
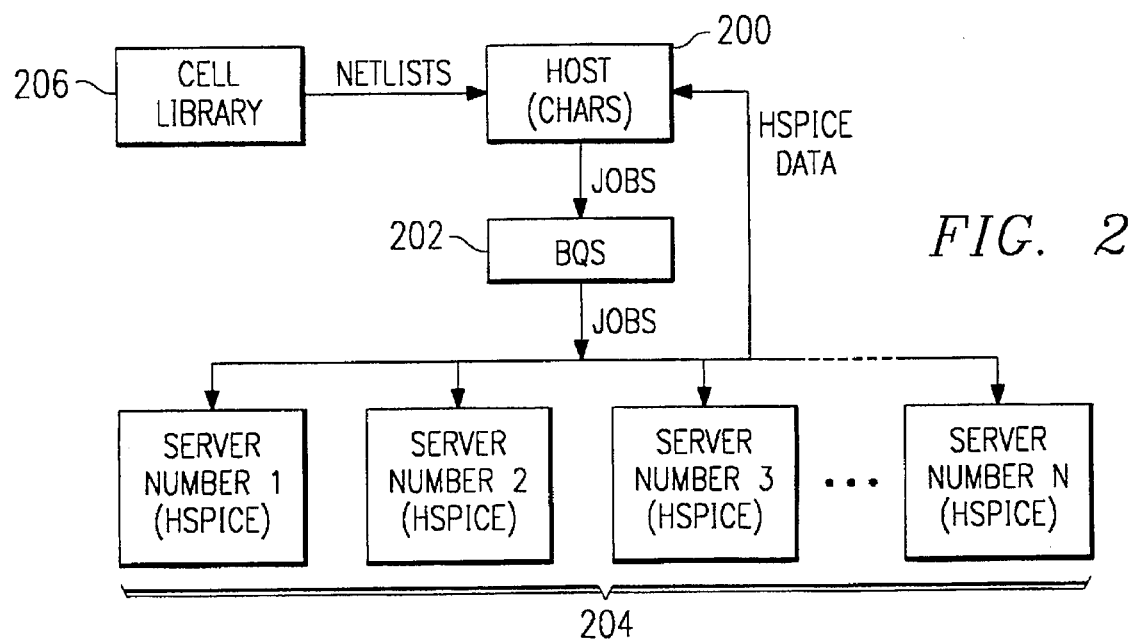
FIG. 2 is a system block diagram of a hardware environment in which the present invention is preferably implemented.

FIG. 2 illustrates an exemplary hardware environment for implementing the method of the present invention. Referring to FIG. 2, a host computer 200 running a characterization tool embodying features of the present invention, herein referred to as CHARS, is connected via a queuing software 202, hereinafter referred to as "BQS," to a plurality of compute servers 204 running HSPICE. As will be described, CHARS is designed to characterize an entire cell library 206 at a time, a task which, for an exemplary cell library comprising 1500 cells, can consume approximately three CPU months of SPICE compute time. To make this task manageable, CHARS incorporates a job flow algorithm which enables it to utilize as many compute servers 204 in parallel as are made available to it. As will also be described, the first task performed by CHARS is to characterize all the driver cells (FIG. 3) to be used in the characterization flow. Each driver is distributed to a different one of the compute servers 204 to reduce the overall time required to characterize the drivers. Next, each cell of the cell library 206 to be characterized is input to the host 200 in the form of a netlist and CHARS generates first pass SPICE decks for each cell at each operating point. CHARS batches sets of decks into jobs that are submitted to BQS 202, which in turn dispatches the jobs to the available compute servers 204. Whenever a first pass job returns to the host 200, CHARS analyzes the output and uses the output to generate a second pass. These jobs are prioritized for dispatch to BQS 202. Once the second pass jobs return, they are analyzed in order to generate timing model files to be used by SYNOPSYS or some other synthesis and optimization tool (not shown).

In a preferred embodiment, CHARS can be provided with a prioritized list of cells for characterization, thereby enabling more critical cells to be submitted to BQS 202 first, without interrupting the flow of keeping all available compute servers 204 one hundred percent utilized. In addition, CHARS utilizes a UNIX file system to preserve its state, thereby allowing easy inspection of its status and easy recovery of specific jobs if either the host 200 or one of the compute servers 204 fails. CHARS also enables a user to specify the maximum number of jobs to have in BQS 202 at any one time. Typically, this parameter should be set to two to three times the number of servers 204 available, so that there are jobs to occupy each of the servers 204 and some jobs waiting to go in as soon as a running job completes.

Figure 3:
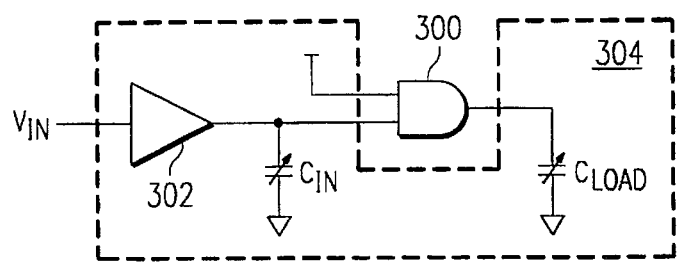
FIG. 3 is a schematic block diagram of a testbed for use in characterizing cells in accordance with the present invention.

To perform the characterization experiments, a method for eliminating the infinite current compliance of HSPICE voltage sources, along with varying the input slope and output load, is necessary. According to a feature of the present invention, this is accomplished through use of a testbed, as shown and described in FIG. 3. Referring to FIG. 3, a cell 300 to be characterized is inserted into a testbed 302. A driver 304 of the testbed 302 drives a first input of the cell 300 to eliminate effects from the infinite current compliance of an HSPICE voltage source $V_{in}$. Varying a pin capacitance $C_{in}$ controls the input transition time of the cell 300. Varying $C_{load}$ controls the output load. In a preferred embodiment, multiple drivers, such as the driver 302, are supported by CHARS, as certain cells, like gated clocks, have special driver requirements.

As will be described, before characterization of any library cell may be performed, each driver, such as the driver 302, must itself be characterized. Accordingly, each driver is driven with a range of output loads ($C_{load}$) to create a table of output transition times versus load for a particular $S_{in}$. This table, along with the pin capacitances of the library cell, can be used to predict the value of $C_{in}$ of the testbed 302 required to produce a particular input transition time for the cell being characterized.

Figure 4A:
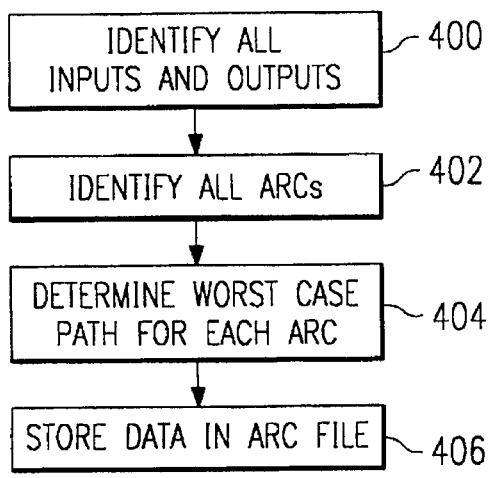
FIG. 4A is a flowchart of an arc generation algorithm of the present invention.
Figure 4B:
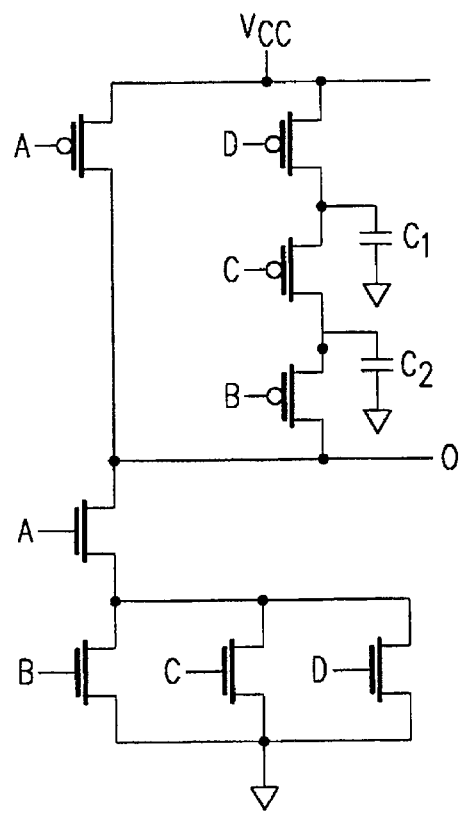
FIG. 4B is a transistor-level schematic diagram of an exemplary cell to be characterized.

In one aspect of the invention, CHARS automatically generates a set of ARC files for all combination logic cells not containing CXFR pass gates, it being understood that custom ARC files must be generated for each remaining cell class. A high level flowchart of an arc generation algorithm implemented by CHARS is shown in FIG. 4A. Referring to FIG. 4A, after a netlist for a cell is read into the algorithm, in step 400, all cell inputs and outputs are identified. In step 402, all input-to-output paths, or "arcs," of the cell are identified. In step 404, for each output node of the cell, the "worst case" path to the output from each input of the cell that may affect that output is determined. Specifically, for a given arc through a cell, there may be more than one solution to "sensitizing" the arc such that a change in the input will effect a change in the output; however there will be only one solution that will capture the worst case capacitance that can be on that input-to-output path. For example, referring to FIG. 4B, setting input signals B, C and D equal to 1, 0 and 0, respectively, would be a viable solution to sensitizing the arc A→O such that a change in an input signal A would result a change in an output signal O; however, setting input signals B, C and D equal to 0, 0 and 1, respectively, is the "worst case" sensitization, since it adds $C_1$ and $C_2$ as additional loads on the arc A→O.

Figure 5:
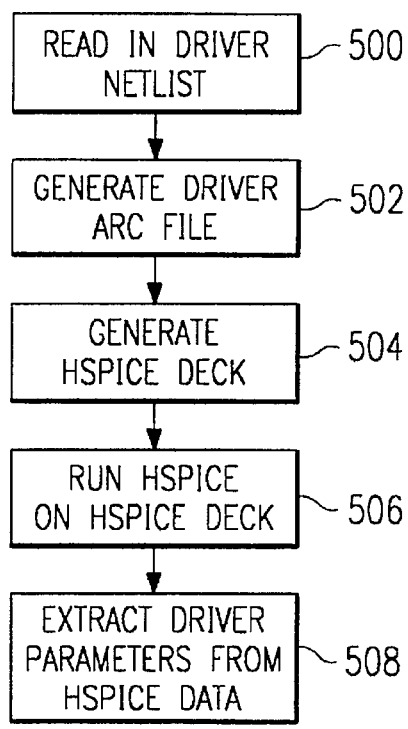
FIG. 5 is a flowchart of a driver characterization algorithm of the present invention.

FIG. 5 is a flowchart illustrating the process of driver characterization, described briefly above. In step 500, a netlist defining the parameters of the driver is read into CHARS. In step 502, CHARS generates an ARC file for the driver 302, as described above with reference to FIGS. 4A and 4B. In step 504, CHARS generates a driver deck for the driver 302. In step 506, the HSPICE deck generated in step 504 is submitted to BQS 202, which in turn submits it to an available one of the servers 204, at which point the deck is input to HSPICE. An excerpt from an exemplary driver characterization HSPICE deck is shown below:

```
.
.
.
.PARAM CLOAD = 0
CLD O VSS CLOAD
V0 I 0 PULSE 0 2.97 10.00n 0.05n 0.05n 100.00n 200.10n
.TRAN 0 10n 210.10n SWEEP DATA = driver_d
.MEAS TRAN DRIVER_FALL TRIG V(O) VAL = 2.67 FALL = 1
+ TARG V(O) VAL = 1.49 FALL = 1
.MEAS TRAN DRIVER_RISE TRIG V(O) VAL = 0.30 RISE = 1
+ TARG V(O) VAL = 1.49 RISE = 1
.OPTIONS BRIEF = 0
.DATA driver_d CLOAD
+ 0.00p
+ 0.10p
+ 0.20p
.
.
.
+ 1.60p
+ 1.70p
+ 1.80p
+ 1.90p
.ENDDATA
.END
```

In step 508, driver parameters are extracted from the HSPICE data and stored in a DRIVER.DB file.

As indicated above, once each of the drivers are characterized, two sets of HSPICE characterization runs, or passes, are performed for sense of each arc of each cell. The first HSPICE pass computes pin capacitances, $V_{th}$ and driver strength ($C_{max}$) of the cell. These values are used as inputs in the second HSPICE pass.

Several files are generated during the CHARS process for each operating point of each sense of each arc of the cell, including a DB file, designated <cell_name>,<op_poin>.db), which is the database file containing all of the measured characterization data, a COEFS file, designated <cell_name>.<op_point>.coefs, which contains all of the timing model coefficients for each arc, a SYNOPSYS file, designated <cell_name>.<op_point>.s, which contains the SYNOPSYS timing model(s) for the cell, and a REG file, designated <cell_name>.<op_point>.reg, which contains regression data comparing how well the SYNOPSYS timing model matches the data from which it was generated.

A CHARS control (CTL) file defines all the parameters used in the automated characterization of the library cells. The CTL file contains several sections, which may defined in any order. Similarly, the parameters within each section may be defined in any order, so long as they are in the correct section. Exemplary sections include a "setup" section for defining various non-characterization related parameters, such as file locations and BQS constants, a "driver" section for defining the driver circuit to use and the parameters with which to characterize the selected driver circuit, a "general" section containing the parameters to be used during cell characterization, a "CPU time" section for controlling load balancing, explained below, for the HSPICE decks, a "cell list" section for defining a list of cells to be characterized, "operating point" section for defining one or more operating points at which to characterize a library.

The following is an excerpt from an exemplary CTL file illustrating a portion of the setup section thereof for defining database paths:

```
begin_setup
   .
   .
   .
# the following describe the database directory structure
# location of the driver char data
driver_dir /p/cs14_lib/char_data/char_dev/driver
# location to store ctl data
ctl_dir /p/cs14_lib/char_data/char_dev/ctl
# storage for job decks
jobs_dir /p/cs14_lib/char_data/char_dev/jobs
# main cell timing database
cel_dir /p/cs14_lib/char_data/char_dev/cells
# cell arc database
arc_dir /p/cs14_lib/char_data/char_dev/arc
# log file to create
log_file /p/cs14_lib/char_data/char_dev/chars.log
# temp file directory
tmp_dir /tmp
# location of custom arc files
arc_src_dir /p/cs14_lib/char_data/custom_arcs
   .
   .
end_setup
```

In the preferred embodiment, the jobs_dir parameter above specifies where to write out job deck and listing files. In a preferred embodiment, five directories are created under this path, including "waiting," which contains job decks that are waiting for insertion into the queue, "running," which contains decks that are running in the queue, "done," which contains decks that have finished running, "bqs," which is the pathname where batches of HSPICE decks are concatenated together into job files when resources are available (jobs are run out of this directory and load balancing is used to control job file sizes), and "analyzed," which is where the deck and output file are moved once the job file has run and the results have been parsed.

The following is an excerpt from an exemplary CTL file illustrating a portion of the setup section thereof for setting BQS parameters:

```
begin_setup
   .
   .
   .
# bqs parameters
bqs_queue charpkg.spice.any      # queue to submit to
bqs_depth 24                      # number of jobs in bqs
bqs_cpu_time 720                  #cpu minutes to allow for deck
#minimum job size to submit
bqs_job_time 1800
# time to wait before retry after a bqs call fails
bqs_fail_backoff 30
# seconds to sleep between job polls
# sleep_period 1800
sleep_period 0
run_spice_call hspice %JOB%.data 1> %JOB%.listing 2>/dev/null;
echo Done
> %JOB%.log
   .
   .
   .
end_setup
```

The following is an excerpt from an exemplary CTL file illustrating a portion of the general section thereof for defining analysis parameters:

```
begin_general
   .
   .
   .
# default driver circuit to use
driver bufd_driver
# voltage step to use when finding vth
vth_sweep_step 0.01
# TRANsient analysis parameters
tran_sweep_time 150
tran_sweep_step .05
# percentage of Vcc to characterize across
vcc_rail_level .90
vss_rail_level .10
   .
   .
end_general
```

The following is an excerpt from an exemplary CTL file illustrating a portion of the general section thereof for defining $C_{max}$ computation parameters:

```
begin_general
   .
   .
   .
# cmax computation parameters
cmax_cap_range 0.0 20        # range of caps to try
cmax_step 1.0                 # step resolution
cmax_max_transition 1.75      # target max transition time
   .
   .
end_general
```

The following is an excerpt from an exemplary CTL file illustrating a portion of the general section thereof for defining an experiment matrix for use in characterizing the cell library 206:

```
begin_general
.
.
.
# specification of the load range to characterize across
# percentages of CMAX to use as load capacitances
load_factors 0.05 0.15 0.25 0.45 0.75 1.00
# percentage of CMAX to use as main load (must be one of above)
main_load_factor 0.45
# index list of loads to use during coefficient computation
load_index_list 1 2 3 4
main_load_index 3
#specification of the slope range to characterize across
rise_delay 0.0 0.5 0.8 1.2 1.75
fall_delay 0.0 0.5 0.8 1.2 1.75
main_slope_rise 0.8        #main slope definition
main_slope_fall 0.8
# index list of slopes to use during coefficient computation
slope_index_list 1 2 3
main_slope_index 3
# the points at which to take characterization data
# may be "sparse" or "matrix"
char_points_set matrix
.
.
.
end_general
```

The following is an excerpt from an exemplary CTL file illustrating a portion of the general section for defining parameters for use in setup and hold experiments:

```
begin_general
.
.
.
# parameters to control setup and hold computation
# time at which the ref signal switches
ref_switch_delay 10
# range of sig rising to try for setup
setup_rise_range 2.0 9.0
# range of sig falling to try for setup
setup_fall_range 2.0 9.0
# range of sig rising to try for hold
hold_rise_range 6.5 12.5
# range of sig falling to try for hold
hold_fall_range 6.5 14.0
# resolution at which to run setup and hold measurements
setup_hold_step 0.2
# propagation delay multiplier for setup measurements
prop_delay_factor 1.05
.
.
.
end_general
```

The following is an excerpt from an exemplary CTL file illustrating a driver section thereof, it being understood that separate driver sections can be defined for multiple driver cells:

```
# This section defines the parameters specific to the characterization of
# the driver circuit. Changing any parameter here will recharacterize the
# driver, which in turn will recharacterize the rest of the library.
begin_driver
driver_netlist_path /p/cs14_lib/char_data/drivers/bufd_driver.cktnam
driver_rise_delay 0.05           # input slope on driver
driver_fall_delay 0.05           # input slope in driver
driver_pulse_width 100           # width of input pulse
driver_pulse_delay 10            # delay of input pulse
driver_tran_step 0.1             # resolution of .TRAN analysis
driver_load_range 0.0 2.00       # load range to char across
driver_load_step 0.1             # load resolution to char at
end_driver
```

```
begin_driver
driver_netlist_path /u/adnan/libs/cs14/drivers/clk_buf_lfs.cktnam
driver_rise_delay 0.05           # input slope on driver
driver_fall_delay 0.05           # input slope in driver
driver_pulse_width 100           # width of input pulse
driver_pulse_delay 10            # delay of input pulse
driver_tran_step 0.1             #resolution of .TRAN analysis
driver_load_range 0.0 5.0        # load range to char across
driver_load_step 0.2             # load resolution to char at
rise_delay 0.0 0.24 0.25 0.26 0.27
fall_delay 0.0 0.334 0.340 0.350 0.356
main_slope_rise 0.25             # main slope definition
main_slope_fall 0.34
end_driver
```

As indicated above, the CPU time section of the CTL file controls the load balancing when generating job files to be sent to BQS 202. A CPU time weight is associated with each type of HSPICE run. Cell HSPICE decks are added into a job file until the sum of the CPU time weights for the files exceeds the value of a bqs_cpu_time. This allows control over how long it takes to run each job file. The following is an excerpt from an exemplary CTL file illustrating the CPU time section thereof:

```
# This section defines the run time associated with each of the different
# types of characterization decks. The submission routines will add cell
# decks to a job file until the sum of the cpu times exceeds the value of
# bqs_job_time. These parameters are not necessarily realistic
# reflections of job run times, but instead are used to control the
# distribution of decks between jobs, and hence servers
begin_cpu_time
driver 2000            # only one driver per deck
pin_cap 5
vth 5
cmax 20
char 200
setup_hold 2000        # only one lat/ff per deck
end_cpu_time
```

As also indicated above, the operating point section of the CTL file defines all the parameters for a particular operating point. Several operating point sections may be defined if the cell library is to be characterized at multiple operating points. Within this section, "name" is the tag used by the system to designate the operating point; "path" is the path to the HSPICE model file to use as seen by the HSPICE compute server; "voltage" is the voltage at which to set power nodes; and "temp" is the junction temperature during the run. The following is an excerpt from an exemplary CTL file illustrating the operating point section thereof:

```
# This section defines the list of operating points at which to characterize
# the library. Adding or deleting operating points will only change the set
# of characterization data that will be kept up to date. However, changing
# the parameters for a given op_point will cause all data for that
# op_point to be recharacterized.
# syntax for op_point definition:
# begin_op_point <op_point_name>
# path <path for spice model on server machine>
# temp <temperature to run at>
# voltage <voltage to characterize at>
# end_op_point
begin_op_point
name cs14_typ_3v
path /usr/local/hspice/clt/cs14/cs14.typ.revd5
voltage 2.97
temp 110.0
end_op_point
begin_op_point
```

```
name cs14_bc_5v
path /usr/local/hspice/clt/s14/cs14.typ.revd5
voltage 5.5
temp 0.0
end_op_point
```

The cell list section of the CTL file defines the set of cells to be included in a particular run. The following is an excerpt from an exemplary CTL file illustrating the cell list section thereof:

```
# This section defines the list of cells to characterize
# Changing this list will only affect the set of cells that are considered to
# be part of the characterizable library
# syntax for cell list definition:
# begin_cell_list <library base path>
# <patterns to match for .cktnam files>
# end_cell_list
# multiple cell lists are allowed
begin_cell_list /p/cs14_lib/char_data/nets_dev
an/*.cktnam
or/*.cktnam
nr/*.cktnam
dff/*.cktnam
lat/*.cktnam
spec/*.cktnam
end_cell_list
```

An ARC file of the CHARS tool defines the logic of a cell in terms of timing characterization arcs, along with other logic level information, such as input and output nodes and function equation for the cell. The information in the ARC file specifies the set of calculations performed on the cell. Since the ARC file contains only abstracted logical information, the same file applies for all sizes of a given cell type. As with the CTL file, the ARC file is divided into several sections. Each section starts with a begin_<section name> and ends with an end_<section name>. The sections in the ARC file can be in any order and the parameters within each section can be in any order as long as the correct grouping is maintained. Certain parameters can have multiple values associated with them. For these parameters, defining all values on one line is equivalent to breaking them into multiple lines. For example,

```
                    vcc I1 I2 I3  # tie I1 I2 I3 to VCC
is equivalent to:
                    vcc I1  # tie I1 to VCC
                    vcc I2  # tie I2 to VCC
                    vcc I3  # tie I3 to VCC
```

A cell definition section of the ARC file provides some general information about the cell. The following shows a cell definition section of an ARC file for a NAND2 (two-input NAND gate) cell:

begin_cell_def
  cell_name NAND2
  vcc_pins VCC
  vss_pins VSS
  input_pins I1 I2
  end_cell_def The following shows a cell definition section of an ARC file for a LAT2 (two-input latch) cell:

begin_cell_def
  cell_name LAT2
  input_pins EN D
  end_cell_def

The information contained in the function declaration section of an ARC file describes the function of the cell output using the SYNOPSYS function syntax. The output signal is followed by the cell's function contained in quotes. + denotes an OR function, * denotes an AND function, ' denotes a not function. Parentheses are allowed to explicitly define precedence. If the cell is sequential and can be mapped to a predefined SYNOPSYS model, such as a latch or flipflop, the output signal can be followed by a net name in double quotes. This option requires that a state definition section be declared.

The following illustrates a function declaration section of an ARC file for a NAND2 cell:

begin_function
  O "(I1 * I2)'"
  end_function

The following illustrates a function declaration section of an ARC file for a LAT2 cell. Since LAT2 is a latch and can be mapped to a SYNOPSYS model, Q is set to IQ. IQ must be defined in the state definition section begin_function
  Q "IQ"
  end_function The state definition section of an ARC file contains information on how to map a cell's signal names to predefined SYNOPSYS models. This section is used when characterizing sequential cells.

Figure 6:
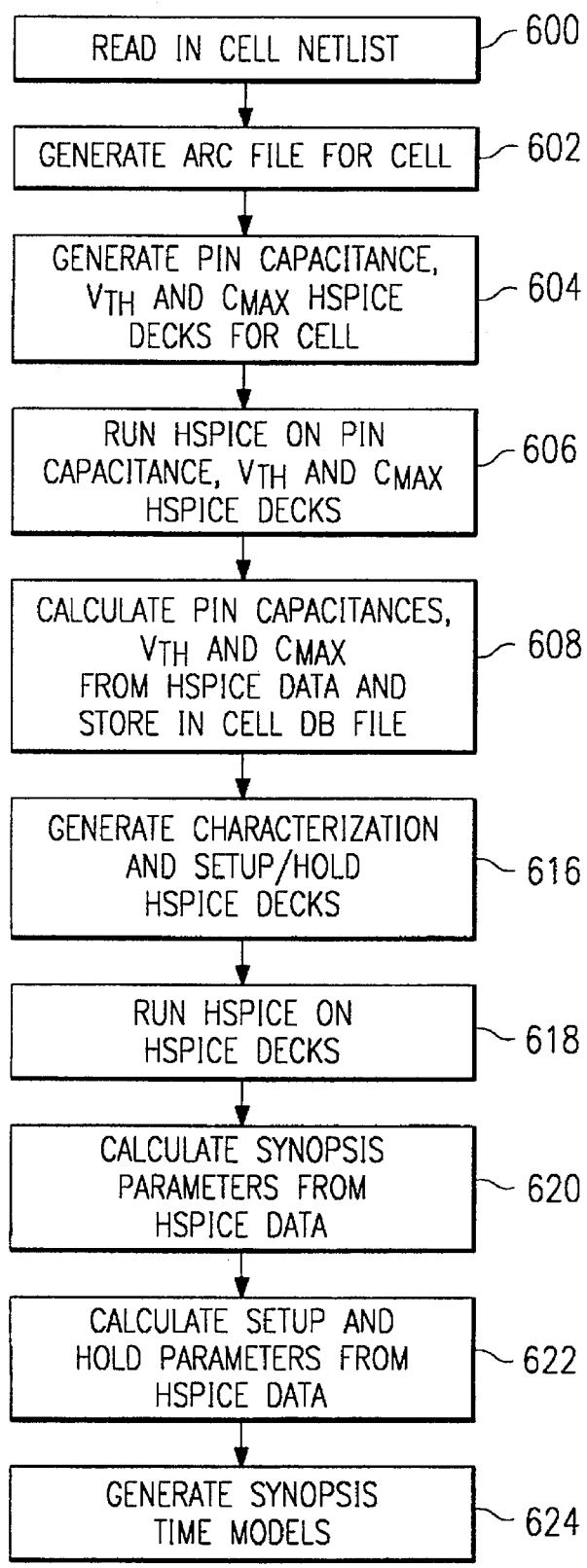
FIG. 6 is a flowchart of a main characterization algorithm of the present invention.

The following shows the state definition for a LAT2 cell. The net names from LAT2 ar mapped to the names of the SYNOPSYS model for a latch. Descriptions of models that can be used may be found in the SYNOPSYS user's manual:

begin_state_def
  latch (IQ, IQN){
  enable :"EN";
  data_in :"D";
  }
  end_state_def The arc definition section contains information about a particular arc to be characterized. An ARC file can contain multiple arc definitions. The following shows the arc definitions for the NAND2 cell:

begin_arc_def
  out O
  sig_rise out_fall
  sig_fall out_rise
  sig I1
  vcc I2
  vth_inv_node O
  end_arc_def
  begin_arc_def
  out O
  sig_rise out_fall
  sig_fall out_rise
  vcc I1
  sig I2
  vth_inv_node O
  end_arc_def The following illustrates the arc definitions for the LAT2 cell:

begin_arc_def
  out Q sig D
vss EN
vth_inv-node DF
end_arc_def
begin_arc_def
out Q
out_fall sig_fall
out_rise sig_rise
sig D
vcc EN
end_arc_def
begin_arc_def
out Q
out_rise sig_rise
timing_type rising_edge
sig EN
vcc D
ic FB high
end_arc_def
begin_arc_def
out Q
out_fall sig_rise
timing_type rising_edge
sig EN
vss D
ic FB low
end_arc_def The setup and hold definition section of an ARC file contains the information necessary to perform setup and hold experiments on cells containing sequential elements, as described in detail below. The following illustrates the setup and hold section for the LAT2 cell begin_setup_hold
sig D
ref EN fall
out Q
watch sig
sig_rise out_rise
sig_fall out_fall
rise_ic FB high
fall_ic FB low
end_setup_hold The following illustrates the setup and hold section for a D flip flop DFF1SCKR cell:

begin_setup_hold
sig D
ref CK rise
out Q
vss R S
watch ref
sig_rise out_rise
rise_ic FB2 high
sig_fall out_fall
fall_ic FB2 low
end_setup_hold FIG. 6 is a flowchart illustrating the method of characterizing a single cell in the cell library. In step 600, a netlist for the cell is read into CHARS. In step 602, CHARS generates an ARC file for the cell, as described above with reference to FIG. 4A. In step 604, using data from the ARC file generated in step 602, CHARS generates pin capacitance HSPICE decks for the cell.

Input and output pin capacitances computed in the first characterization run are used in the linear timing model. The input pin capacitances are also used to compute the values for $C_{in}$. The static capacitances for the library cell are measured using a CAPTAB option provided by HSPICE. The following is an excerpt from an exemplary HSPICE deck used for pin capacitance analysis:

```
.
.
.
V1 I2 0 dc 2.97
V0 I1 PWL 0n 0 10n 0 10.05n 1.49 20n 1.49
.OPTION CAPTAB
.TRAN 1n 20n
meas tran dummy find V(O) when V(I1) = 1.49
.END
```

As previously described, $V_{th}$ is the input voltage at which the cell begins to switch, that is, the DC input voltage at which the input voltage equals the output voltage. Propagation delay is measured from $V_{th}$, rather than Vcc/2, to prevent negative propagation delays for cells with $V_{th}<Vcc/2$ for very fast cells. In addition, the maximum output load ($C_{max}$) of a cell is the maximum load that all arcs of the cell can drive while maintaining an output transition time less than a specified parameter, designated cmax_max_transition. In one embodiment, cmax_max_transition equals 1.75 nanoseconds (ns). $C_{max}$ is computed by running the cell across a wide range of loads and then interpolating the load which can be driven within the specified output transition time. $C_{max}$ is calculated in order to find the range of loads that could reasonably be driven by the cell.

Referring again to FIG. 6, in step 606, the HSPICE decks generated in step 604 are submitted to BQS 202, which in turn submits it to an available one of the servers 204, at which point the deck is input to HSPICE. In step 608, CHARS calculates cell pin capacitance values from the resulting HSPICE data by extracting the appropriate parameters from the HSPICE data and stores the values in the DB file associated with the cell.

In step 610, CHARS generates HSPICE decks used for $V_{th}$ and $C_{max}$ calculations, using data from the ARC, DRIVER.DB and DB files. The following is an excerpt from an exemplary HSPICE deck used for $V_{th}$ calculations:

```
.
.
.
V1 I2 0 dc 2.97
V0 I1 0 dc 0
DC V0 0 2.97 0.01
.meas dc vth find V(I1) when V(I1) = V(O)
.END
```

The following is an excerpt from an exemplary HSPICE deck used for $C_{max}$ calculations:

```
.
.
V1 I2 0 dc 2.97
.PARAM CIN = 0 CLOAD = 0
CAPOUT O 0 CLOAD
CAPIN I1 0 CIN
XDRIVER VCC VSS DRIVERI I1 bufd_driver
.TRAN .05n 150n SWEEP DATA = arc_data
VDRIVER DRIVERI 0 PWL 0 2.97 10n 2.97 10.05n 0 150.00n 0
.MEAS TRAN IN_FALL TRIG V(I1) VAL = 2.67 FALL = 1
+ TARG V(I1) VAL = 1.49 FALL = 1
.MEAS TRAN PROP_RISE TRIG V(I1) VAL = 1.49 FALL = 1
+ TARG V(O) VAL = 1.49 RISE = 1
.MEAS TRAN TRAN_RISE TRIG V(O) VAL = 0.30 RISE = 1
+ TARG V(O) VAL = 1.49 RISE = 1
.OPTIONS BRIEF = 0
.DATA arc_data CIN CLOAD
*max_transition = 1.75n
+ 6.11e-13 0
+ 6.11e-13 1e-12
+ 6.11e-13 2e-12
.
.
.
+ 6.11e-13 1.8e-11
+ 6.11e-13 1.9e-11
+ 6.11e-13 2e-11
.ENDDATA
.END
```

Referring again to FIG. 6, in step 612, the $V_{th}$ and $C_{max}$ HSPICE decks generated in step 610 are submitted to BQS 202, which in turn submits them to an available one of the servers 204, at which point the decks are input to HSPICE. In step 614, values for $V_{th}$ and $C_{max}$ are computed by extracting the appropriate parameters from the resulting HSPICE data and stored in the DB file for the cell.

Once all of the preliminary data, specifically, pin capacitances, $V_{th}$ and $C_{max}$ data, have been collected for the cell, a second set of HSPICE jobs is run to obtain timing data for the cell. As will be described, experiments to calculate setup and hold data for sequential cells are also performed if needed.

It is important to characterize each cell across the range of loads that it can realistically drive. In the characterization decks, $C_{in}$ on the testbed is varied to get a set of predefined input transition times and $C_{load}$ is set to a predefined set of fractions of $C_{max}$. At each experiment point for a cell (i.e., each arc for each sensitization at each matrix entry), the input transition, output transition and propagation delay of the cell is measured. Accordingly, in step 616, CHARS generates characterization and/or setup/hold HSPICE decks for the cell using information stored in the ARC, DB, and DRIVER.DB files. The following is an excerpt from an exemplary characterization HSPICE deck used for the final characterization of the cell:

```
.
.
V1 I2 0 dc 2.97
.PARAM CIN = 0 CLOAD = 0
```

```
CAPOUT O 0 CLOAD
CAPIN I1 0 CIN
XDRIVER VCC VSS DRIVERI I1 bufd_driver
.TRAN .05n 150n SWEEP DATA = arc_data
VDRIVER DRIVERI 0 PWL 0 2.97 10n 2.97 10.05n 0 150.00n 0
.MEAS TRAN IN_FALL TRIG V(I1) VAL = 2.67 FALL = 1
+ TARG V(I1) VAL = 1.40 FALL = 1
.MEAS TRAN PROP_RISE TRIG V(I1) VAL = 1.40 FALL = 1
+ TARG V(O) VAL = 1.49 RISE = 1
.MEAS TRAN TRAN_RISE TRIG V(O) VAL = 0.30 RISE = 1
+ TARG V(O) VAL = 1.49 RISE = 1
.OPTIONS BRIEF = 0
.DATA arc_data CIN CLOAD
*main_cin = 5.e-13 main_cload = 2.94e-13
+ 3.44e-14 3.27e-14
+ 3.44e-14 9.8e-14
+ 3.44e-14 1.63e-13
.
.
.
+ 1.68e-12 2.94e-13
+ 1.68e-14 4.9e-13
+ 1.68e-14 6.53e-13
.ENDDATA
.END
```

Setup and hold parameters are computed only for sequential cells, such as latches and flipflops. Both the setup and hold parameters relate to the edges of the ENABLE, or CLOCK, signal that latches data into the flipflop from the D input thereof. Setup time is the latest that input signal D ("sig") can change relative to the CLOCK signal ("ref") such that the new state of sig is reliably latched into the cell. A latch is considered to be in setup violation if sig to Q, or OUTPUT (out), propagation delay is greater than a predefined propagation delay factor, or prop_delay_factor, times the nominal delay through the arc. A flipflop is considered to be in setup violation if the ref to out propagation delay is greater than prop_delay_factor times the nominal delay through the arc. The last experiment not to be in setup violation is used to compute the setup time.

Hold time is the earliest sig can change relative to ref without the new value of sig being latched in. A latch or flipflop is in hold violation if out switches beyond Vcc/2. The first experiment not to be in hold violation is used to measure the hold time.

For each setup and hold measurement, a series of experiments are run with sig transitioning at increasingly later times relative to ref. For setup measurements, sig gets a slow transition while ref gets a fast transition. For hold measurements, sig gets a fast transition while ref gets a slow transition.

Figure 7:
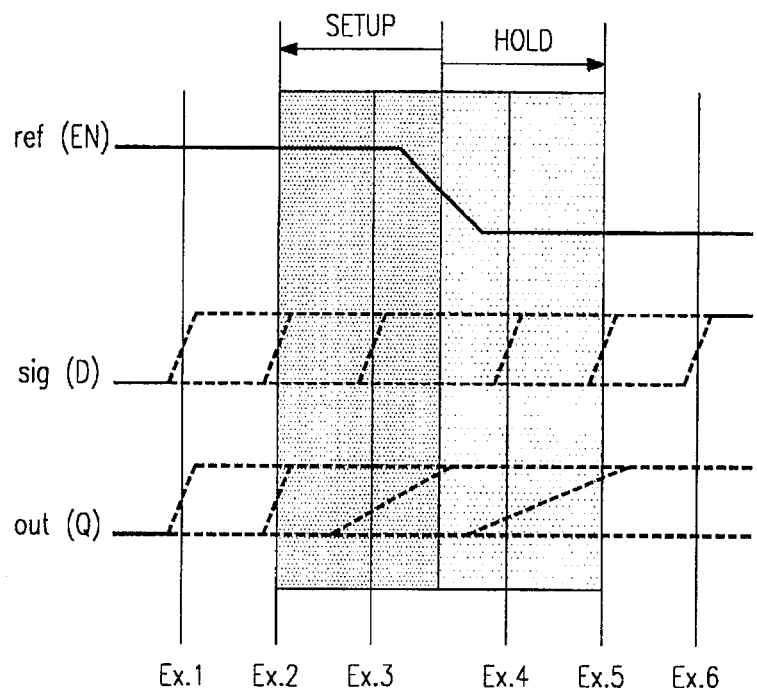
FIG. 7 illustrates setup and hold waveforms used to determine setup and hold times of a sequential logic cell.

FIG. 7 illustrates a particular set of wave forms for the setup and hold experiment. As shown in FIG. 7, six sets of experiments, designated EX1–EX6, were performed. EX3 illustrates an example of a setup violation. EX4 illustrates an example of a hold violation. Of the six experiments, EX2 should be used to measure setup time and EX5 should be used to measure hold time.

The following is an excerpt from an exemplary setup/hold HSPICE deck used for computing setup and hold data for a cell:

```
.PARAM CIN_REF = 0 CIN_SIG = 0 TD_SIG = 0
.PARAM 'TD1 = TD_SIG + 0.05n'
CAPOUT Q 0 7.21e-13
CAP_REF EN 0 CIN_REF
CAP_SIG D 0 CIN_SIG
XDR_REF VCC VSS REF_IN EN bufd_driver
XDR_SIG VCC VSS SIG_IN D bufd_driver
VDR_REF REF_IN 0 PWL 0n 2.97 10.00n 2.97 10.05n 0.00 150.00n 0.00
VDR_SIG SIG_IN 0 PWL 0n 0.00 TD_SIG 0.00 TD1 2.97 150.00n 2.97
.IC V(FB) = 2.97
.TRAN 0.05n 150.00n SWEEP DATA = arc_data
.MEAS TRAN SH_PROP_DEL TRIG V(D) VAL = 1.47 RISE = 1
+TARG V(Q) VAL = 1.49 RISE = 1
.MEAS TRAN SIG_REF TRIG V(D) VAL = 1.47 RISE = 1
+ TARG V(EN) VAL = 1.49 FALL = 1
.OPTIONS BRIEF = 0
.DATA arc_data CIN_REF CIN_SIG TD_SIG
* ref_node EN falling
* setup
+ 0 1.72e-12 2e-09
+ 0 1.72e-12 2.2e-09
+ 0 1.72e-12 2.4e-09
.
.
.
+ 0 1.72e-12 7.4e-09
+ 0 1.72e-12 7.6e-09
*hold
+ 1.67e-12 0 6.5e-09
+ 1.67e-12 0 6.7e-09
+ 1.67e-12 D 6.9e-09
.
.
.
+ 1.67e-12 0 1.21e-08
+ 1.67e-12 0 1.23e-08
+ 1.67e-12 0 1.25e-08
.ENDDATA
.END
```

Figure 8A:
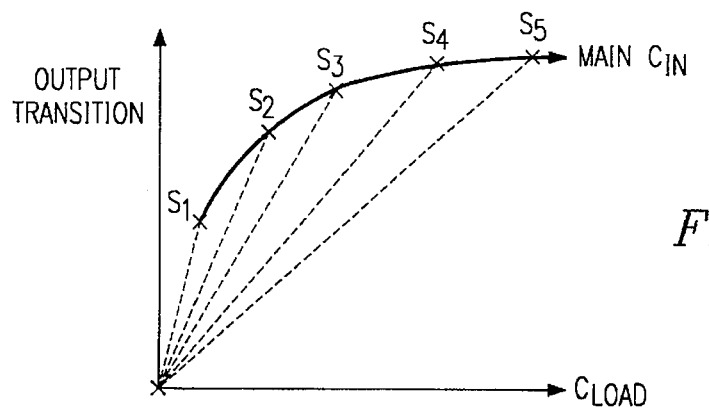
FIGS. 8A and 8B illustrate a method of computing selected timing coefficients in accordance with a feature of the present invention.

In step 618, the characterization and/or setup/hold decks are submitted to BQS 202, which in turn submits the decks to an available server 204, at which point the decks are input to HSPICE. In step 620, SYNOPSYS parameters are computed from the resulting HSPICE data for storage in a SYNOPSYS parameters ("S") file. In particular, the three timing coefficients for the linear model are computed in the following order: $a_2$ (resistance); $a_1$ (slope effect), and $a_0$ (intrinsic). In these calculations, $C_{load}$ includes the self loads (i.e., output capacitance) of the cell. As illustrated in FIG. 8A, the output transition time for an arc may be plotted against $C_{load}$ for a typical $C_{in}$. The slopes from the origin to each data point S1–Sn are compared and the results are averaged to obtain $a_2$. In the SYNOPSYS model, "$a_2 C_{load}$" represents the output transition time. Since the best-fit line through the HSPICE data tends not to go through the origin, this approach attempts to fit the model to the data in the best manner possible. For example, if the data points occurred as shown in FIG. 8A, $a_2$ would be determined by the following equation:

$$a_2 = \left( \sum_{i=1}^{n} S_i \right) / n$$

where n is equal to the number of relevant data points.

Figure 8B:
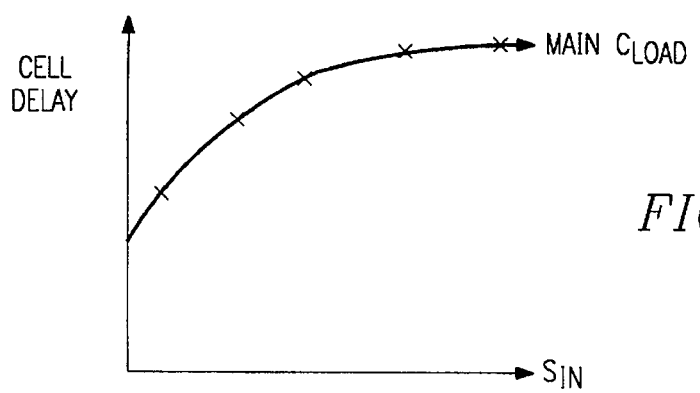

As shown in FIG. 8B, the cell delay for the arc may be plotted against input transition time for a typical $C_{load}$. $a_1$ is computed by performing a linear regression on input transition delay vs. propagation delay data at the main output load. For example, if the data points occurred as shown in FIG. 8B, $a_1$ would be determined by the following equation:

$$a_1 = \left( n \sum_{i=1}^{n} x_i y_i - \sum_{i=1}^{n} x_i \sum_{i=1}^{n} y_i \right) / \left( n \sum_{i=1}^{n} x_i^2 - \sum_{i=1}^{n} x_i \sum_{i=1}^{n} y_i \right)$$

where n is equal to the number of relevant data points.

Once $a_1$ and $a_2$ have been computed for the cell, $a_0$ is solved for at each of the experiment points using the following equation:

$$a_0 = \text{propagation delay} - a_1(\text{input transition time}) - a_2 C_{load}$$

The results are averaged across all the experiment points to yield $a_0$. The timing coefficients $a_2$, $a_1$ and $a_0$ are stored in the COEFS file.

In addition, CHARS uses the data stored in the DB file for the cell to generate lookup tables indexed by $C_{load}$ and $S_{in}$ for use by SYNOPSYS look-up table model. In step 622, the setup and hold parameters are calculated, if necessary, by extracting the appropriate parameters from the HSPICE data, and then stored in the COEFS, DB and SYNOPSYS files. In step 624, CHARS generates the appropriate SYNOPSYS timing model or models, that is, the linear and/or table look-up model, and stores the model(s) in the SYNOPSYS file.

In one aspect of the present invention, the CHARS tool includes two additional related tools for use during the characterization of cell libraries, which are POSTP and REGSTAT. POSTP runs only the postprocessing module of CHARS and can be used to generate SYNOPSYS files from existing SPICE data. REGSTAT summarizes the regression data for each cell into a single report showing how well the linear model matches the SPICE data.

After SPICE data has been generated by CHARS, POSTP an be use to fine tune the coefficient computation by biasing it toward some subset of the SPICE data. The tool is also useful in regenerating the SYNOPSYS file if certain hints were missing or incorrect in the ARC file and the experiments were run correctly.

REGSTAT generates a report showing how well the computed linear model fits the actual SPICE dataI. The tool reports five types of data, including: average error (AVG ERR), average absolute error (AVG ABS), average percent error (AVG ERR %), average percent absolute error (ABS ERR %) and standard deviation (STD DEV). The following is an excerpt from an exemplary report generated using REGSTAT:

```
Reading cell list ... Found 1410 cells
Process : cs14_typ_3v
AVG ERR AVG ABS AXTG ERR% STD DEV
.
.
.
CELL: nand2c
I1 to O rise  -8.33e-05  0.0719  0.649  9.9
I1 to O fall  -8.33e-05  0.0707  0.588  9.23
I2 to O rise  -1.73e-18  0.108   2.32   13.9
I2 to O fall  -8.33e-05  0.0328 -0.61   4.12
Total nand2c: -6.25e-05  0.0709  0.738  9.96
.
.
.
CELL: zbuf2e
I to O rise  0          0.16    1.15   6.81
I to O fall  8.33e-05   0.102   0.674  4.95
E to O rise  -4.63e-18  0.181   1.2    7.35
E to O fall  0.000167   0.101   0.698  5.01
Total zbuf2e : 6.25e-05  0.136   0.932  6.13
```

It is understood that the present invention can take many forms and embodiments. The embodiments shown herein are intended to illustrate rather than to limit the invention, it being appreciated that variations may be made without departing from the spirit of the scope of the invention. For example, the invention could be used to compute timing parameters for optimization and/or synthesis tools other than SYNOPSYS.

Although illustrative embodiments of the invention have been shown and described, a wide range of modification, change and substitution is intended in the foregoing disclosure and in some instances some features of the present invention may be employed without a corresponding use of the other features. Accordingly, it is appropriate that the appended claims be construed broadly and in a manner consistent with the scope of the invention.

What is claimed is:

1. A method of characterizing a plurality of cells comprising a cell library, the method comprising, for each of said cells:

sensitizing each arc of said cell;

storing results of said sensitizing in an arc file associated with said cell;

computing input capacitances, a threshold voltage and a maximum output load for said cell using said sensitizing results stored in said arc file;

storing said computed input capacitances, threshold voltage and maximum load in a database file associated with said cell;

for each sense of each arc of said cell, using a testbed comprising a driver cell to conduct a matrix of experiments varying input transition times and output loads to generate a matrix of characterization data; and computing timing model coefficients for input to a synthesis and optimization tool from said characterization data;

wherein before characterization of any of said cells can be performed, said driver cell must be characterized.

2. The method of claim 1 wherein said synthesis and optimization tool is SYNOPSYS.

3. The method of claim 2 wherein said timing model comprises a lookup table timing model of the form "$t_d$= cell_delay+output_tran," where $t_d$ represents a propagation delay of said cell, cell_delay represents a cell delay of said cell and output_tran represents an output transition time of said cell and where values for cell_delay and output_tran for a matrix of combinations of output loads and input transition times are stored in a lookup table associated with said cell.

4. The method of claim 2 wherein said timing model comprises a linear timing model of the form "$t_d = a_0 + a_1 S_{in} + a_2 C_{load}$," where $t_d$ represents a propagation delay of said cell, $S_{in}$ represents an input transition time of said cell, $C_{load}$ represents an output load of said cell, and $a_0$, $a_1$ and $a_2$ are timing coefficients.

5. The method of claim 4 wherein a value for $a_1$ is computed by performing a linear regression on input transition delay versus propagation delay data at a main output load.

6. The method of claim 4 wherein a value for $a_2$ is computed by performing a linear regression on output load versus propagation delay data at a main input slope.

7. The method of claim 1 wherein said cell contains sequential elements, the method further comprising computing setup and hold times for said cell.

8. The method of claim 1 wherein said sensitizing comprises, for each output node of said cell, determining a worst case electrical path from said output node to each input node of said cell.

9. The method of claim 1 wherein said computing input capacitances, a threshold voltage and a maximum output load for said cell comprises:

generating a first set of SPICE decks for said cell using said sensitizing results stored in said arc file;

running SPICE on said first set of SPICE decks to generate a first set of SPICE data;

calculating input threshold voltage, an input load and an output load for said cell from said first set of SPICE data;

storing said calculated input threshold voltage, input load and output load for said cell in said database file.

10. The method of claim 1 wherein said computing timing model coefficients comprises:

generating a second set of SPICE decks using said database and arc files;

running SPICE on said second set of SPICE decks to generate a second set of SPICE data;

calculating said timing coefficients from said second set of SPICE data.

11. The method of claim 1 further comprising using said timing coefficients to generate timing models for use by said synthesis and optimization tool.

12. An apparatus for characterizing a plurality of cells comprising a cell library, the method comprising, for each of said cells:

means for sensitizing each arc of said cell;

means for storing results of said sensitizing in an arc file associated with said cell;

means for computing input capacitances, a threshold voltage and a maximum output load for said cell using said sensitizing results stored in said arc file;

means for storing said computed input capacitances, threshold voltage and maximum load in a database file associated with said cell;

means for conducting a matrix of experiments varying input transition times and output loads to generate a matrix of characterization data for each sense of each arc of said cell, said means for conducting a matrix of experiments comprising a testbed including a driver cell; and means for computing timing model coefficients for input to a synthesis and optimization tool from said characterization data.

13. The apparatus of claim 12 wherein said synthesis and optimization tool is SYNOPSYS.

14. The apparatus of claim 13 wherein said timing model comprises a lookup table timing model of the form "$t_d$= cell_delay+output_tran," where $t_d$ represents a propagation delay of said cell, cell_delay represents a cell delay of said cell and output_tran represents an output transition time of said cell and where values for cell_delay and output_tran for a matrix of combinations of output loads and input transition times are stored in a lookup table associated with said cell.

15. The apparatus of claim 14 wherein said timing model comprises a linear timing model of the form "$t_d = a_0 + a_1 S_{in} + a_2 C_{load}$," where $t_d$ represents a propagation delay of said cell, $S_{in}$ represents an input transition time of said cell, $C_{load}$ represents an output load of said cell, and $a_0$, $a_1$ and $a_2$ are timing coefficients.

16. The apparatus of claim 15 further comprising means for performing a linear regression on input transition delay versus propagation delay data at a main output load to compute a value for $a_1$.

17. The apparatus of claim 15 further comprising means for performing a linear regression on output load versus propagation delay data at a main input slope to compute a value for $a_2$.

18. The apparatus of claim 12 wherein said cell contains sequential elements, the apparatus further comprising the means for computing setup and hold times for said cell.

19. The apparatus of claim 12 wherein said means for sensitizing comprises means determining, for each output node of said cell, a worst case electrical path from said output node to each input node of said cell.

20. The apparatus of claim 12 wherein said means for computing input capacitances, a threshold voltage and a maximum output load for said cell comprises:

means for generating a first set of SPICE decks for said cell using said sensitizing results stored in said arc file;

means for running SPICE on said first set of SPICE decks to generate a first set of SPICE data;

means for calculating input threshold voltage, an input load and an output load for said cell from said first set of SPICE data;

means for storing said calculated input threshold voltage, input load and output load for said cell in said database file.

21. The apparatus of claim 12 wherein said means for computing timing model coefficients comprises:

means for generating a second set of SPICE decks using said database and arc files;

means for running SPICE on said second set of SPICE decks to generate a second set of SPICE data;

means for calculating said timing coefficients from said second set of SPICE data.

22. The apparatus of claim 12 further comprising means for using said timing coefficients to generate timing models for use by said synthesis and optimization tool.

23. A system for automatically characterizing a plurality of cells comprising a cell library, the system comprising:

a host computer for executing a first set of logic instructions;

a storage device electrically connected to said host computer for storing netlist descriptions of cells comprising said cell library;

a plurality of servers each for executing a second set of logic instructions;

wherein said first set of logic instructions comprises instructions for causing said host computer to generate a set of arc files for each of said cells comprising said cell library, generate a set of first pass circuit level simulator program ("CLSP") decks for each of said cells using information stored in arc files, batch said first pass CLSP decks into jobs of a predetermined size, and submit each of said jobs to an available one of said servers;

wherein said second set of logic instructions comprises instructions for computing an input capacitance, threshold voltage and maximum load for a cell using said set of first and returning said computed input capacitance, threshold voltage and maximum load values to said host computer;

wherein said first set of logic instructions further comprises instructions for causing said host computer to generate a set of second pass CLSP decks for each of said cells using said computed input capacitance, threshold voltage and maximum load for said cell, batch said second pass CLSP decks into jobs of a predetermined size, and submit each of said jobs to an available one of said servers;

wherein said second set of logic instructions further comprises instructions for causing said server to compute characterization data for said cells from said second pass CLSP decks and to return said computed characterization data to said host computer; and wherein said first set of logic instructions further comprises instructions for causing said host computer to generate timing models from said returned characterization data, said timing model data being for submission to a synthesis and optimization tool.

24. The system of claim 23 wherein said synthesis and optimization tool is SYNOPSYS.

25. The system of claim 23 wherein said CLSP is SPICE.

\* \* \* \* \*

UNITED STATES PATENT AND TRADEMARK OFFICE
CERTIFICATE OF CORRECTION

PATENT NO. : 5,655,109

DATED : AUGUST 5, 1997

INVENTOR(S) : HAMID

It is certified that error appears in the above-identified patent and that said Letters Patent is hereby corrected as shown below:

Col. 3, line 11: "analyze" should read --analyzed--

Col. 3, line 27: "achieve" should read -- achieved--

Col. 7, line 2: "poin>" should read --point>--

Col. 7, line 13: insert --be-- after the word "may"

Col. 9, line 58: delete "#" before the words "the driver"

Col. 9, line 58: insert --#-- after the word "circuit"

Col. 9, line 59: delete "#" before the word "driver"

Col. 9, line 59: insert --#-- after the word "will"

Col. 10, line 27: delete "#" before the word "types"

Col. 10, line 27: insert "#" after the word "of"

UNITED STATES PATENT AND TRADEMARK OFFICE
CERTIFICATE OF CORRECTION

PATENT NO. : 5,655,109

DATED : AUGUST 5, 1997

INVENTOR(S) : HAMID

It is certified that error appears in the above-identified patent and that said Letters Patent is hereby corrected as shown below:

Col. 10, line 28: delete "#" before the word "decks"

Col. 10, line 28: insert "#" before the word "sum"

Col. 10, line 29: delete "#" before the word "bqs"

Col. 10, line 29: insert "#" after the word "not"

Col. 10, line 30: delete "#" before the word "reflections"

Col. 10, line 54: delete "#" before the words "the library"

Col. 10, line 54: insert "#" after the word "library"

Col. 10, line 55: delete "#" before the word "of"

Col. 10, line 55: insert "#" after the word "data"

Col. 10, line 56: delete "#" before the word "the"

Col. 10, line 56: insert "#" before the word "cause"

Col. 10, line 57: delete "#" before the word "op"

UNITED STATES PATENT AND TRADEMARK OFFICE
CERTIFICATE OF CORRECTION

PATENT NO. : 5,655,109

DATED : AUGUST 5, 1997

INVENTOR(S) : HAMID

PAGE 3 of 3

It is certified that error appears in the above-identified patent and that said Letters Patent is hereby corrected as shown below:

Col. 11, line 16: delete "#" before the word "be"

Col. 11, line 16: insert --#-- after the word "the"

Col. 12, line 31: "ar" should read --are--

Col. 17, line 31: "D" should read --0--

Col. 19, line 2: "an be use" should read --it can be used--

Col. 19, line 8: "datal." should read --data.--

Signed and Sealed this

Seventh Day of July, 1998

*Attest:*

*Attesting Officer*

BRUCE LEHMAN

*Commissioner of Patents and Trademarks*